United States Patent [19]
Goedicke et al.

[11] Patent Number: 5,698,314
[45] Date of Patent: Dec. 16, 1997

[54] COMPOUND BODY OF VACUUM-COATED SINTERED MATERIAL AND PROCESS FOR ITS PRODUCTION

[75] Inventors: Klaus Goedicke; Gunter Hotzsch; Fred Fietzke, all of Dresden; Olaf Zywitzki, Freiberg; Siegfried Schiller, Dresden; Jonathan Reschke, Dresden; Wolfgang Hempel, Dresden, all of Germany

[73] Assignee: Fraunhofer-Gesellschaft Zur Forderung Der Angewandten Forschung E.V., Munich, Germany

[21] Appl. No.: 445,521

[22] Filed: May 22, 1995

[51] Int. Cl.⁶ .................................................. C23C 14/00
[52] U.S. Cl. .................. 428/336; 428/698; 428/701; 428/702; 204/192.1; 204/192.15; 204/192.22
[58] Field of Search ..................... 428/336, 216, 428/698, 701, 702; 204/192.1, 192.15, 192.22

[56] References Cited

U.S. PATENT DOCUMENTS

| | | | |
|---|---|---|---|
| 3,714,473 | 1/1973 | Hale | 427/255 |
| 3,836,392 | 9/1974 | Lux et al. | 117/169 R |
| 4,463,062 | 7/1984 | Hale | 428/702 |
| 5,071,696 | 12/1991 | Chatfield et al. | 428/698 |
| 5,137,774 | 8/1992 | Ruppi | 428/216 |
| 5,256,266 | 10/1993 | Blanchette et al. | |
| 5,350,607 | 9/1994 | Tyson et al. | 427/566 |
| 5,357,389 | 10/1994 | Blanchette et al. | |
| 5,492,606 | 2/1996 | Stauder et al. | |
| 5,543,019 | 8/1996 | Lee et al. | |

FOREIGN PATENT DOCUMENTS

| | | |
|---|---|---|
| 0539694 | 5/1993 | European Pat. Off. . |
| 0605299 | 7/1994 | European Pat. Off. . |
| 2233700 | 1/1973 | Germany . |
| 2253745 | 1/1982 | Germany . |
| 252205 | 9/1986 | Germany . |
| 3802852 | 8/1989 | Germany . |
| 4110005 | 10/1992 | Germany . |
| 4110006 | 10/1992 | Germany . |
| 4223505 | 11/1993 | Germany . |
| 1464022 | 2/1977 | United Kingdom . |
| 9425637 | 11/1994 | WIPO . |

OTHER PUBLICATIONS

Thornton and Chin, "Structure and Heat Treatment Characteristics of Sputter–Deposited Alumina", *Ceramic Bulletin*, vol. 56, No. 5, 1977, pp. 504–512, cited and described on p. 3, first full paragraph, of the instant application.

Scherer, Latz, and Patz; Proc. 7th Int. Conf. IPAF, Geneva, 1989, p. 181 et al., entitled "A novel solution for the fast deposition of Al2O3 by DC reactive magnetron sputtering", cited and described on p. 3 penultimate paragraph, of the instant application.

(List continued on next page.)

*Primary Examiner*—Archene Turner
*Attorney, Agent, or Firm*—Greenblum & Bernstein, P.L.C.

[57] ABSTRACT

Compound body of a vacuum coated sintered material and a process for its production. Such compound bodies, when coated in a known manner, have a carrier of sintered material coated with a layer that is thermally, mechanically and chemically unstable, with their surface showings cracks and being partially porous. These shortcomings are overcome via an improved eco-friendly vacuum deposition process, wherein at least one layer of a material, having an outer layer of $Al_2O_3$, is applied to the carrier of sintered material at a maximum of 800° C., with this layer being completely crystalline and comprised of an $\alpha Al_2O_3$ phase and possibly of a $\gamma Al_2O_3$ phase with a (440) texture, having a compressive stress of at least 1 GPa and a hardness of at least 20 GPa, with the $Al_2O_3$ layer being deposited via reactive magnetron sputtering, wherein the magnetrons are pulse driven, the pulse frequency lies between 20 and 100 Khz and the deposition rate is at least 1 nm/s, with the resulting compound bodies being utilized for cutting treatments, particularly as cemented carbide inserts.

35 Claims, 1 Drawing Sheet

OTHER PUBLICATIONS

Bunshah, Schramm; entitled "Alumina deposition by activated reactive evaporation, in *Thin Solid Films* 40 (1977)", pp. 211–216, cited and described on p. 4, first paragraph, of the instant application.

"Characterization of L–$Al_2O_3$, K–$Al_2$ $0_3$:L–k Multioxide Coatings of Cemented Carbides" Thin Solid Films 193/194 (1996) 536–546.

"Alumina Deposition by Activated Reactive Exploration Than Solid Fibers" 40 (1977) 211–216.

English Translation of JP–59–to 223 published Sep. 1984.

COMPOUND BODY OF VACUUM-COATED SINTERED MATERIAL AND PROCESS FOR ITS PRODUCTION

CROSS REFERENCE TO RELATED APPLICATIONS

This application is the cognate of German Application No. DE 195 18 779.2, filed May 22, 1995, the disclosure of which is incorporated herein by reference in its entirety.

BACKGROUND OF THE INVENTION

1. Field of the Invention

This invention pertains to a compound body, whose carrier is comprised of a sintered material, upon which one or more surface layers are applied, of which at least one layer is deposited via vacuum deposition and comprised of aluminum oxide ($Al_2O_3$). Such compound bodies are used, for example, as cutting tools in cutting operations. Preferably, such compound bodies are utilized as cemented carbide inserts.

2. Discussion of the Background of the Invention and Material Information

There are known compound bodies that include an $Al_2O_3$ layer, that is deposited via chemical vapor deposition (CVD), at temperatures above 1000° C., onto a carrier of sintered material. Such layers are crystalline and include, in addition to the thermodynamically stable α-phase, in general, additional metastable phases, particularly the κ-phase (DE 22 33 700; DE 22 53 745). At the required high temperatures, during the production of the compound body and the differing thermal coefficients of expansion of the materials, the carriers are exposed to extreme loads, which as a result thereof, worsen the mechanical properties thereof. During their use as cutting tools, such compound bodies succumb to high temperatures. Such high temperatures are accompanied with phase changes, particularly the κ-phase. The layers have a rough surface and a relatively high coefficient of friction. Due to a volume contraction during the phase change, a distinct fissure or crack formation and a delamination between the layer and the carrier body results. Therefrom, there results the disadvantage that drastically limits the use of the compound bodies with reference to service life. In order to limit the delamination in cutting tools, the cutting edges of the carrier must be rounded off. Thus, there result substantial limits of the cutting performance and the surface quality of the machined work pieces.

In addition, there are known compound bodies that have an $Al_2O_3$ layer deposited via plasma-enhanced CVD processes (DE 41 10005; DE 41 10 006). Such layers include process-conditioned impurities, that emanate from an incomplete chemical reaction. These layers, for example, include a chlorine content of 0.5 to 3.5%. The $Al_2O_3$ layers, on these compound bodies, include, in addition to the crystalline α-$Al_2O_3$, generally a high portion of amorphous aluminum oxides. As a result thereof, there is the disadvantage that as well as the impurities in the $Al_2O_3$, the amorphous phase causes an insufficient chemical, mechanical and thermal stability of the layer on the compound body. Also known are fine grained layers of solely α-$Al_2O_3$ layers on compound bodies. Therein, a dimensioning rule is indicated as being derived for the fine grain structure from the full width at half maximum of the interference lines of the X-ray diffraction analysis (XRD) of the microstructure of the layers. As the production process, a plasma-CVD-process, having the previously noted disadvantages (DE 41 10 005; DE 41 10 006) is described. It can be assumed that the line width in the XRD analysis arises mainly from the lattice distortions due to the impurities of the layers, and not, as indicated, only from the fine grained microstructure of the structure of the $Al_2O_3$ layers. Generally, all of the CVD processes require the use of toxic substances and are therefore environmentally damaging.

It is furthermore known to deposit $Al_2O_3$ layers on carrier bodies via radio frequency diodes or magnetron sputtering (Thornton and Chin, Ceramic Bulletin, 56 [1977] page 504). It is also described therein that crystalline α-$Al_2O_3$ layers can also be produced with this process but only when the compound body is exposed to a temperature of at least 1000° C. during the coating. Otherwise, a supplemental heat treatment at 100 to 1250° C. is required. The disadvantages associated therewith correspond to those of the layers that are deposited via the CVD process.

It has also been described that with $Al_2O_3$ layers, that are produced via sputtering, a relatively high hardness can be achieved, but these layers show an amorphous structure, which is disadvantageous for the stability thereof during use (Scherer, Latz and Patz; Proc. 7th Int. Conf. IPAT, Geneva, 1989, page 181).

Thus, it can be determined that the known vacuum coated compound bodies of sintered materials are always accompanied with shortcomings. In addition, the compound bodies, whose carriers are coated with $Al_2O_3$ via CVD or RF sputtering processes, are expensive to produce since all of the noted processes enable only a low deposition rate of less than 1 nm/s. If compound bodies are, in order to increase the deposition rate, produced with an $Al_2O_3$ layer via reactive vacuum evaporation of the carrier, the resulting $Al_2O_3$ layers are porous and of insufficient hardness, even if the carrier, during the coating, is heated to a temperature of 1000° C. (Bunshah, Schramm; Thin Solid Films 40 [1977]1211).

It is the task or object of this invention to eliminate the deficiencies of the state of the art. A compound body is to be produced with a thermal, mechanical and chemically stable $Al_2O_3$ layer which has a smooth, crack-free surface. The process for its production should be environmentally Surprisingly even for those skilled in the art, a compound body was produced with an outer layer of completely crystalline α-$Al_2O_3$, even the carrier thereof, during the deposition of the layer, does not exceed a maximum of 800° C. It was further determined that a temperature of 600° C. is already sufficient to deposit the noted layer. The $Al_2O_3$ layer typically includes a portion of maximally 1 at % argon. Other impurities cannot be determined via use of the customary analytical methods such as electron probe microanalysis (EMPA). The crystalline size is typically in the range of 0.5 to 2 μm. The properties of the compound body are largely identical if the noted $Al_2O_3$ layer is not totally of the α phase, but consists partially of textured γ$Al_2O_3$. For these layers a smaller crystalline size has been observed, preferably in the range of 0.05 to 0.1 μm. The formation of the described crystalline phases, particularly the formation of pure α $Al_2O_3$ layers, appears to stand in contradiction or opposition to all currently generally accepted thermodynamically-established development postulations for this phase. According thereto, an activation temperature for the formation of α $Al_2O_3$ would be required which can be achieved only above a temperature of 1000° C. Evidently, the process in accordance with this invention causes, via a not individually understood additional activation of the components of aluminum and oxygen in the plasma, a notable additional contribution to the required activation energy.

Beyond the specific material properties of α $Al_2O_3$, the noted assessments of the residual compressive stress and the noted crystallite sizes are responsible for the high hardness of the outer layer of the compound body. The suitable assessment of residual compressive stress assures that no premature failure of the layer occurs via mechanical fracture formation during abrasive loading of the compound body. On the other hand, the residual compressive stress can be held so low that the adhesion of the $Al_2O_3$ layer on the carrier can be achieved without difficulty. This is of special importance when the carrier is provided with one or several surface layers that are applied as intermediate layers prior to the deposition of the $Al_2O_3$ layer. Suitable interlayers are preferably known hard material layers such as TiN, (Ti,Al)N or TiC. The intermediate layer may comprise at least one of a metal and a metallic compound including a member selected from the group consisting of Ti, Zr, Cr, Al, Nb and Hf.

The process for the production of the compound body utilizes in a preferable manner known basic processes and arrangements for the deposition of electrically insulating compound layers via magnetron sputtering without the use of an RF discharge. The pulse-shaped excited or energized plasma assures the stability of the sputtering process in spite of the high insulative ability of the $Al_2O_3$ layers and prohibits process interruptions via electrical arcing. The suggested principle permits the use of such a high deposition rate and plasma density during the pulse-on time, so that obviously the assumed plasma activation is achieved during the layer formation of the crystalline α $Al_2O_3$. An essential process characteristic is also the pulse-formed alternating impacting of the layers being formed with negative and positive charge carriers of the noted minimum current density.

An advantageous embodiment of the process utilizes devices with unipolar pulsed plasma via the use of aluminum targets sputtered in a reactive gas.

A further, particularly advantageous embodiment utilizes the dual arrangement of two aluminum targets, that are fed via a bipolar (alternating) voltage and in which the Al targets alternately form a cathode and an anode during the magnetron sputtering. The setting of the oxygen content in the plasma is influenced via geometric limitations of the sputter device and must therefore be determined experimentally. The required oxygen content is, obviously, due to the increased temperature of the carrier to be coated, substantially higher than the content that must be set in general practice for the deposition of stoichiometric aluminum oxide layers. Connected therewith is a heavier or thicker covering of the Al target with the $Al_2O_3$. The dynamic balance or equilibrium between the formation of $Al_2O_3$ on the target and its resputtering provides a further reason that, molecular fragments are present in the vapor phase which are a prerequisite for the formation of crystalline phases with process-required or procedure driven low temperatures of the carrier.

Both process embodiments are preferably carried out under the influence of effect of an alternating voltage or potential, namely a so-called pulse-bias-potential, at the carriers. The settings, in accordance with this invention, of the values for residual compressive stress and the hardness of the $Al_2O_3$ layers on the carrier is achieved via the adaptation or adjusting of this potential.

The compound bodies produced by the process of this invention have the advantage that the limiting of the temperature to the range of 600° C. to 800° C. during the production of the compound bodies has wide ranging consequences upon the compound body. If the carrier is comprised of a sintered material which, for example contains tungsten carbide and cobalt then, via the noted limitation of the temperature, the noted damage during the hard material coating of the carrier is avoided, since no appreciable diffusion, no pore formation and no brittle or fragile phases occur. As a result thereof, the compound body retains its characteristic good low temperature mechanical properties. The direct deposition of the thermodynamically stable α $Al_2O_3$ phase without subsequent phase changes is the reason for the complete absence of cracks or fissures of the compound body. Even the $Al_2O_3$ layers with a large portion of γ $Al_2O_3$ shows no crack or fissure formation when they are subsequently heated over 1000° C. In contrast to compound bodies made in accordance with this invention, distinguish themselves via a very smooth surface and an at least one order of lesser roughness. This value corresponds with very low wear rates during abrasive loading. The use of the compound body as cutting tools permits the achievement of extended tool life. As a result of the phase composition, the crystallite size and the high packing density of the outer layer, the compound bodies exhibit an excellent durability or resistance with reference to acids, bases and corrosive media that are contained in the lubricants normally used in cutting operations.

BRIEF DESCRIPTION OF THE DRAWINGS

The invention will be better understood and objects other than those set forth above will become apparent when consideration is given to the following detailed description thereof. Such description makes reference to the annexed drawings wherein throughout the various figures of the drawings, there have generally been used the same reference characters to denote the same or analogous components and wherein.

DETAILED DESCRIPTION OF THE PREFERRED EMBODIMENTS AND BEST MODE

Figure 1:
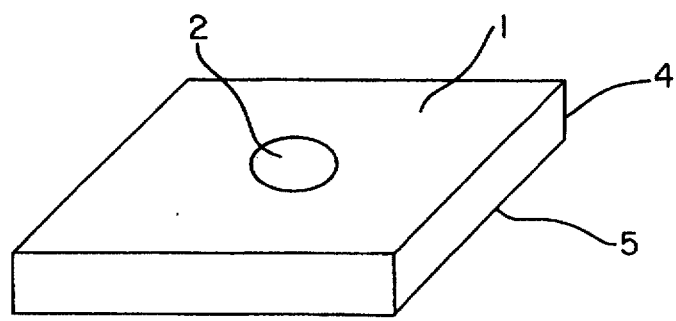
FIG. 1 illustrates an embodiment of the compound body of this invention without a coating.
Figure 2:
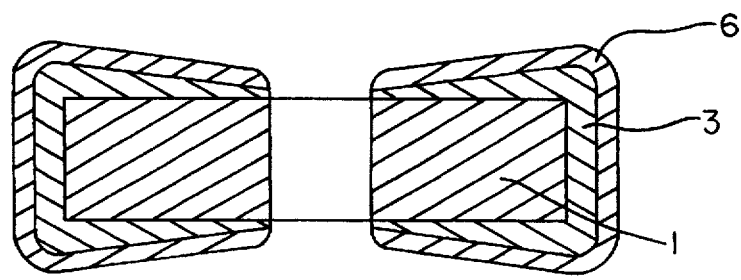
FIG. 2 is a sectional view through a coated compound body of this invention.

With respect to the drawings it is to be understood that only enough of the construction of the invention and the surrounding environment in which the invention is employed have been depicted therein, in order to simplify the illustrations, as needed for those skilled in the art to readily understand the underlying principles and concepts of the invention.

A parallelepiped-shaped carrier 1, serving as a foundation or base body, has the dimensions of 15×15×5 $mm^3$, is comprised of a sintered material formed of tungsten carbide and cobalt, as well as sintering promoter-type materials. An aperture 2 serves for the fixing or holding of carrier 1 during the further process steps for the production of the compound body as well as for the fixing or holding during its use. On carrier 1 there is a layer 3 of TiC, applied via a known vacuum deposition or layering process. In the region of the edges or borders 4,5, the thickness of this layer 3 is about 6 μm. The thickness of layers 3 in the direction toward aperture 2 decreases due to process limitations. Carrier 1, together with layers 3, forms the foundation or base body, upon which an $Al_2O_3$ layer 6 is vacuum deposited. Layer 3, in conjunction with $Al_2O_3$ layer 6, forms an intermediate layer or interface. The $A_2O_3$ layer 6 has, in the region of edges or borders 4,5, a thickness of 4 μm. The thickness of $Al_2O_3$ layer 6 is also reduced in the region of aperture 2.

It is a specific characteristic of the compound body, that during the deposition of $Al_2O_3$ layer 6 that it is exposed to a maximum temperature of 700° C. and that the $Al_2O_3$ layer is completely crystalline in form.

Figure 3:
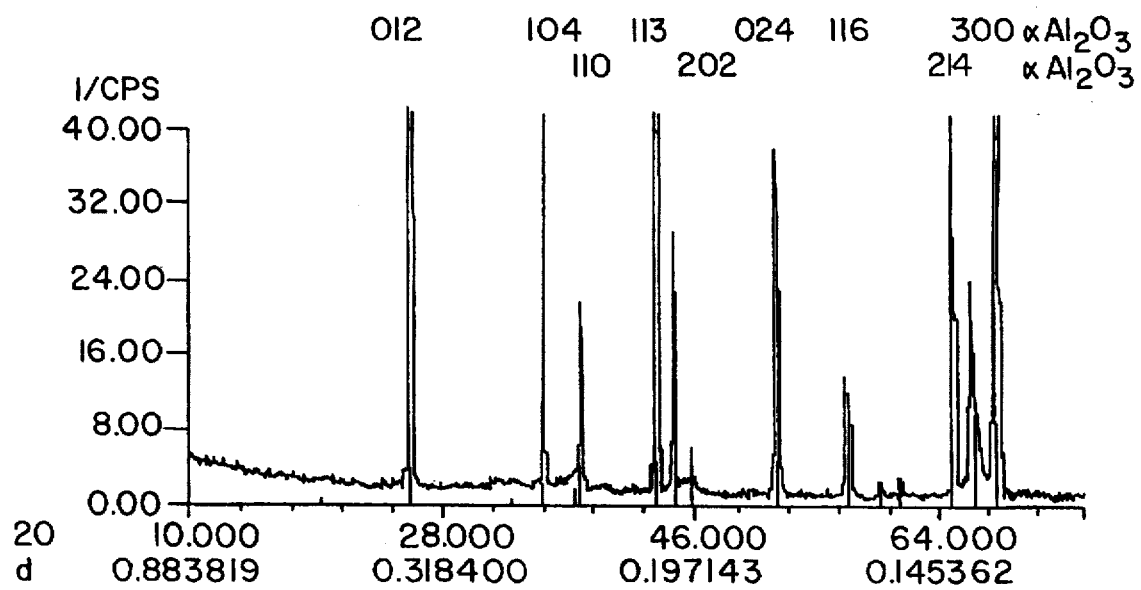
FIG. 3 illustrates the results of an X-ray analysis of the microstructure of the outer surface of a coated compound body of this invention.

FIG. 3 shows the result of the X-ray analysis of the microstructure of $Al_2O_3$ layer 6. It was obtained with a CuKα radiation in an X-ray diffractometer. As the abscissa, the spacing of the lattice planes d, the Bragg angle 2θ respectively, is illustrated. As the ordinate, the intensity of the interferences is shown. The interference lines of the α-$A_2O_3$ phase can be recognized. Metastable phases are not present.

Additional characteristics of the $Al_2O_3$ layer 6 are a minimum residual compressive stress of 1 GPa (in the example, the region of the residual stress was determined as 3.0±0.5 GPa), as well as a high hardness of 23 GPa. This quantity was determined via micro hardness test HV 0.01. An electron probe micro analysis shows an argon content of (0.3±0.1) at % in $Al_2O_3$ layer 6, as well as the absence of further impurities with a concentration above the detection boundary of this method. The compound body exhibits excellent adhesion strength of the surface layers, a very low medium roughness in comparison with CVD layers and a coefficient of friction against steel of less than 0.15. As a result of its properties, the compound body is utilized as a high performance cemented carbide insert in the cutting treatment of steels with discontinuous and continuous cutting. In comparison with conventional cemented carbide cutting tool inserts, the compound body distinguishes itself via a greater load carrying capacity and a distinctly increased service life.

The process for the production of the compound body is practiced as follows: The carrier, which is comprised of sintered material and a TiC layer applied thereupon is, after cleaning, inserted into a vacuum deposition apparatus and pre-processed in a low pressure glow discharge via an etching process. Via an efficient radiation heater in the interior of the vacuum deposition apparatus, a temperature for the carrier is set at 700° C. and held constant. For the deposition of the $Al_2O_3$ layer, the carrier, via the use of the apertures, is retained on rotating rod-shaped retainers, wherein the spacing between each two carriers is 30 mm. Via planet-type movements, it is achieved that all of the areas of the carrier that are to be coated are exposed to the layer forming particle stream. The production of the particle stream is achieved via an arrangement of two magnetron sputter sources with aluminum targets, that are so connected with an efficient special sinusoidal generator that, at a pulse change or alternating frequency of 50 kHz, both sputter sources alternate as anode and cathode of the sputter arrangement. A pressure of 0.1 Pa is set in the vacuum deposition apparatus. The gas is comprised of argon and a portion of about 25 at % oxygen. For the setting of a stable operation of the sputter arrangement and the exact adjustment of the oxygen portion, the magnetron sputter sources are initially lit with pure argon gas and thereafter the oxygen content increased to such an extent until a predetermined point is reached in the voltage-current characteristic and predetermined line intensities, controlled via optical spectroscopy, are obtained. With the feeding into the magnetron sputter sources of electrical energy of 30 kW, a deposition rate for $Al_2O_3$ is reached that corresponds to a value of 8 nm/s at a fixedly arranged carrier. The $Al_2O_3$ layer being formed is exposed to the intense pulse-plasma in the vicinity of the magnetron sputter sources.

The shortest distance between the moving carriers and the targets of the magnetron sputter sources is 30 mm. The carriers are additionally electrically conductively connected at their aperture with the retainers. The retainers are connected together, in such a manner, during the deposition of the $Al_2O_3$ layer, with a sinusoidal alternating voltage source, at a frequency of 10 kHz, that an effective alternating voltage of ±28 volts, relative to the plasma, and a pulsating current of alternating polarity is set, which corresponds to a charge carrier current of a medium current density of 1.2 $mA/cm^2$, with reference to the growing $Al_2O_3$ layer. The coating process for the deposition of the $Al_2O_3$ layer distinguishes itself, in spite of the high electrical insulation property of the $Al_2O_3$ layer, which is deposited on all of the inner walls of the vacuum deposition arrangement, via a high long term stability. Upon reaching the noted thickness of the $Al_2O_3$ layer, the magnetron sputter sources are switched off. After cooling of the coated carriers, they are removed from the vacuum deposition apparatus. The coated compound bodies are ready for their utilization without further thermal follow-up treatments.

While there are shown and described present best mode embodiments of the invention, it is to be distinctly understood that the invention is not limited thereto, but may be otherwise variously embodied and practiced within the scope of the following claims and the reasonably equivalent compounds thereto. Further, the invention illustratively disclosed herein may be practiced in the absence of any element which is not specifically disclosed herein.

What is claimed is:

1. A compound body of vacuum coated sintered material, comprising a carrier of sintered material and an outer layer being comprised of $Al_2O_3$ deposited via a vacuum deposition process, wherein the $A_2O_3$ layer is applied in totally crystalline form at a maximum of 800° C. and is comprised of at least an α-$Al_2O_3$-phase, and wherein the $Al_2O_3$ layer has a residual compressive stress of at least 1 GPa and a hardness of at least 20 GPa, and is essentially free of impurities other than argon.

2. The compound body of claim 1, wherein the $Al_2O_3$ layer has a thickness in the range of 1 to 10 μm.

3. The compound body of claim 2, wherein the $Al_2O_3$ layer has a thickness of approximately 3 μm.

4. The compound body of claim 1, further comprising at least one intermediate layer interposed between the $Al_2O_3$ layer and the carrier, wherein the at least one intermediate layer includes at least one layer comprising at least one of a metal and a metallic compound including a member selected from the group consisting of Ti, Zr, Cr, Al, Nb and Hf.

5. The compound body of claim 4, wherein the $Al_2O_3$ layer has a thickness in the range of 1 to 10 μm.

6. The compound body of claim 5, wherein the $Al_2O_3$ layer has a thickness of approximately 3 μm.

7. The compound body of claim 4, wherein the metallic compounds are selected from the group consisting of oxides, nitrides, oxynitrides, carbides and carbonitrides.

8. The compound body of claim 7, wherein the $Al_2O_3$ layer has a thickness in the range of 1 to 10 μm.

9. The compound body of claim 8, wherein the $Al_2O_3$ layer has a thickness of approximately 3 μm.

10. The compound body of claim 9 wherein the $Al_2O_3$ layer further includes a γ$Al_2O_3$-phase having a (440)-texture.

11. The compound body of claim 10, wherein the $Al_2O_3$ layer has a thickness in the range of 1 to 10 µm.

12. The compound body of claim 11, wherein the $Al_2O_3$ layer has a thickness of approximately 3 µm.

13. The compound body of claim 10, further comprising at least one intermediate layer interposed between the $Al_2O_3$ layer and the carrier, wherein the at least one intermediate layer includes at least one layer comprising at least one of a metal and a metallic compound including a member selected from the group consisting of Ti, Zr, Cr, Al, Nb and Hf.

14. The compound body of claim 13, wherein the metallic compounds are selected from the group consisting of oxides, nitrides, oxynitrides, carbides and carbonitrides.

15. The compound body of claim 13, wherein the $Al_2O_3$ layer has a thickness in the range of 1 to 10 µm.

16. The compound body of claim 15, wherein the $Al_2O_3$ layer has a thickness of approximately 3 µm.

17. A process for the production of a compound body comprising a carrier of sintered material and an outer layer comprising $Al_2O_3$, the process comprising:

applying an outer layer of $Al_2O_3$, via reactive magnetron sputtering in a vacuum and at a temperature of not more than 800° C., to an element comprising a carrier of sintered material, the reactive magnetron sputtering comprising:
depositing the $Al_2O_3$ layer via pulsed magnetron sputtering via a delivery of oxygen-containing gas;
setting the pulse frequency in the range of 20 to 100 Khz for achieving a deposition at a deposition rate of at least 1 nm/s, with reference to a stationarily arranged carrier; and
alternating a pulse-shaped current, from a positive to a negative charge carrier, with the current having a medium current density of at least 1 mA/cm$^2$ and a pulse frequency of at least 5 kHz, occurring at the carrier;
wherein the $Al_2O_3$ layer is in totally crystalline form and is comprised of at least an α-$Al_2O_3$-phase, and wherein the $Al_2O_3$ layer has a residual compressive stress of at least 1 GPa and a hardness of at least 20 GPa, and is essentially free of impurities other than argon.

18. The process of claim 17, wherein the element further comprises at least one intermediate layer coating the carrier, the at least one intermediate layer comprising at least one member selected from the group consisting of Ti, Zr, Cr, Al, Nb and Hf metals and metallic compounds.

19. The process of claim 18, further including applying the at least one intermediate layer via vacuum coating.

20. The process of claim 19, further including accomplishing the vacuum coating via magnetron sputtering.

21. The process of claim 17 wherein the pulse frequency is approximately 50 kHz.

22. The process of claim 17, wherein the depositing of the $Al_2O_3$ layer is accomplished via the sputtering of two commonly acting Al targets; and alternately switching the targets as a cathode and as an anode of a magnetron sputtering apparatus.

23. The process of claim 22, wherein the element further comprises at least one intermediate layer coating the carrier, the at least one intermediate layer comprising at least one member selected from the group consisting of Ti, Zr, Cr, Al, Nb and Hf metals and metallic compounds.

24. The process of claim 23, further including applying the at least one intermediate layer via vacuum coating.

25. The process of claim 24, further including accomplishing the vacuum coating via magnetron sputtering.

26. The process of claim 17, wherein the depositing of the $Al_2O_3$ layer is accomplished via the sputtering of an Al target of a magnetron sputtering apparatus.

27. The process of claim 26, wherein the element further comprises at least one intermediate layer coating the carrier, the at least one intermediate layer comprising at least one member selected from the group consisting of Ti, Zr, Cr, Al, Nb and Hf metals and metallic compounds.

28. The process of claim 27, further including applying the at least one intermediate layer via vacuum coating.

29. The process of claim 28, further including accomplishing the vacuum coating via magnetron sputtering.

30. A compound body of vacuum coated sintered material, comprising a carrier of sintered material and an outer layer comprising $Al_2O_3$, wherein the $Al_2O_3$ is in totally crystalline form and is comprised of at least an α-$Al_2O_3$-phase, and wherein the $Al_2O_3$ layer has a residual compressive stress of at least 1 GPa and a hardness of at least 20 GPa, and is essentially free of impurities other than argon.

31. The compound body of claim 30, wherein the $Al_2O_3$ layer has a thickness in the range of 1 to 10 µm.

32. The compound body of claim 31, wherein the $Al_2O_3$ layer has a thickness of approximately 3 µm.

33. The compound body of claim 30, further comprising at least one intermediate layer interposed between the $Al_2O_3$ layer and the carrier, wherein the at least one intermediate layer includes at least one layer comprising at least one of a metal and a metallic compound including a member selected from the group consisting of Ti, Zr, Cr, Al, Nb and Hf.

34. The compound body of claim 33, wherein the metallic compounds are selected from the group consisting of oxides, nitrides, oxynitrides, carbides and carbonitrides.

35. The compound body of claim 30, wherein the $Al_2O_3$ layer further includes a γ-$Al_2O_3$-phase having a (440)-texture.

* * * * *

UNITED STATES PATENT AND TRADEMARK OFFICE
Certificate

Patent No. 5,698,314            Patented: December 16, 1997

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Klaus Goedicke; Gunter Hotzsch; Fred Fietzke; Olaf Zywitzki; Siegfried Schiller; Jonathan Reschke; Wolfgang Hempel; Bernard North; and Prem Jindal.

Signed and Sealed this Nineteenth Day of September, 2000.

DEBORAH JONES
*Supervisory Patent Examiner*
Patent Examining Art Unit 1775